United States Patent [19]
DiMarco

[11] Patent Number: 5,644,773
[45] Date of Patent: Jul. 1, 1997

[54] SENSE AMPLIFIER TIMING METHOD AND APPARATUS FOR PEAK POWER REDUCTION

[75] Inventor: David DiMarco, Hillsborough, Oreg.

[73] Assignee: Intel Corporation, Santa Clara, Calif.

[21] Appl. No.: 308,114

[22] Filed: Sep. 15, 1994

Related U.S. Application Data

[62] Division of Ser. No. 175,929, Dec. 30, 1993, Pat. No. 5,422,781.

[51] Int. Cl.⁶ .............................. G11C 13/00; G06F 1/26
[52] U.S. Cl. ...................... 395/750; 365/226; 365/227
[58] Field of Search ........................ 365/208, 226, 365/227, 233.5, 222, 194, 207; 395/750, 445, 280, 454

[56] References Cited

U.S. PATENT DOCUMENTS

| | | | |
|---|---|---|---|
| 3,402,398 | 9/1968 | Koerner et al. | |
| 3,560,940 | 2/1971 | Gaensslen | |
| 4,587,629 | 5/1986 | Dill et al. | 395/493 |
| 4,916,671 | 4/1990 | Ichigachi | 365/233 |
| 5,053,998 | 10/1991 | Kannan et al. | 365/194 |
| 5,214,610 | 5/1993 | Houston | 365/233.5 |
| 5,323,354 | 6/1994 | Matsumoto et al. | 365/229 |
| 5,386,394 | 1/1995 | Kawahara et al. | 365/208 |
| 5,418,479 | 5/1995 | Sambandan | 326/93 |
| 5,422,781 | 6/1995 | DiMarco | 365/226 |
| 5,430,683 | 7/1995 | Hardin et al. | 365/227 |

OTHER PUBLICATIONS

Popescu, V., et al., "The Metaflow Architecture," *IEEE Micro*, pp. 10–13, 63–73 (Jun. 1991).

*Primary Examiner*—Glenn A. Auve
*Attorney, Agent, or Firm*—Blakely, Sokoloff, Taylor & Zafman

[57] ABSTRACT

An apparatus and method for enabling multiple sense amps in a burst read memory is described. The sense amps are divided into two sets which are then enabled at slightly different times. The time difference is set so that a maximum power consumption experienced when the sense amps are enabled is reduced significantly, but the effect on the total time needed to read the data is not increased.

10 Claims, 3 Drawing Sheets

SENSE AMPLIFIER TIMING METHOD AND APPARATUS FOR PEAK POWER REDUCTION

This is a divisional of application Ser. No. 08/175,929, filed Dec. 30, 1993, now U.S. Pat. No. 5,422,781.

BACKGROUND OF THE INVENTION

1. Field of the Invention

The invention relates to a method and apparatus for sending enable signals to sense amplifiers ("amps") in a computer memory. More particularly, the invention provides for the delay of a portion of those enable signals so that the peak power consumed by the sense amps enabled by the enable signals at any one time is minimized.

2. Prior Art

To read data from a memory circuit array, sense amps located at the ends of sense lines are generally utilized. When a read request is received by the memory circuit, a storage element is coupled to a sense line and the sense amp located at the end of the sense line is enabled to detect the voltage on the sense line, and to drive a corresponding logic signal onto the output line.

With the introduction of systems that utilize burst mode read operations from memory and wide data words of 64 bits or larger, sense amplifier induced supply noise can reach excessive levels. Typically, in a burst read operation, data is sensed for all words in the burst simultaneously. When sense amps are enabled they typically have an initial period of increased power consumption as they begin to drive the capacitive loads on their outputs. When multiple sense amps are enabled simultaneously, as in a burst read operation, the power surge that occurs can introduce undesirable supply noise into the system. This supply noise problem in wide word burst memories has reached the point where a new system is desired.

BRIEF SUMMARY OF THE INVENTION

An objective of the invention is to provide a method and apparatus for enabling multiple sense amps in a burst read memory circuit while minimizing the power surge that occurs as a result. When the invention is incorporated into a memory, the peak power consumption that results from a read cycle is reduced. This overall reduction allows individual sense amps to be larger, providing the benefit of reducing the response time of the memory circuit. Additionally, the size of the power busing area which provides power to the memory circuit may be reduced.

In a preferred embodiment, the invention includes a multiplexer circuit in combination with a delay element. The sense lines used to read out the various memory locations are divided into two groups, called "chunks," each having a set of sense enable lines. When a read request is detected the memory circuit determines which chunk should be sensed first, and based on this determination, signals a multiplexor to introduce a delay into the enable signal sent to the set of sense amps which sense the other chunk. This method allows the chunk burst order to be different from one read access to the next. The two enable signals are then distributed using a synchronization circuit so that one set of sense amps is enabled slightly before the other. The result is that the peak power consumed by the circuit at any one time is reduced as compared to a circuit which enables all sense amps simultaneously.

In accordance with another aspect of the invention, a computer system is provided having a microprocessor, a memory, and input/output devices coupled to a system bus. A cache memory circuit is coupled to the microprocessor and is located within the same package as the microprocessor. The cache memory circuit includes sense amps and multiplexer circuits as set forth above.

DETAILED DESCRIPTION OF THE INVENTION

Figure 1:
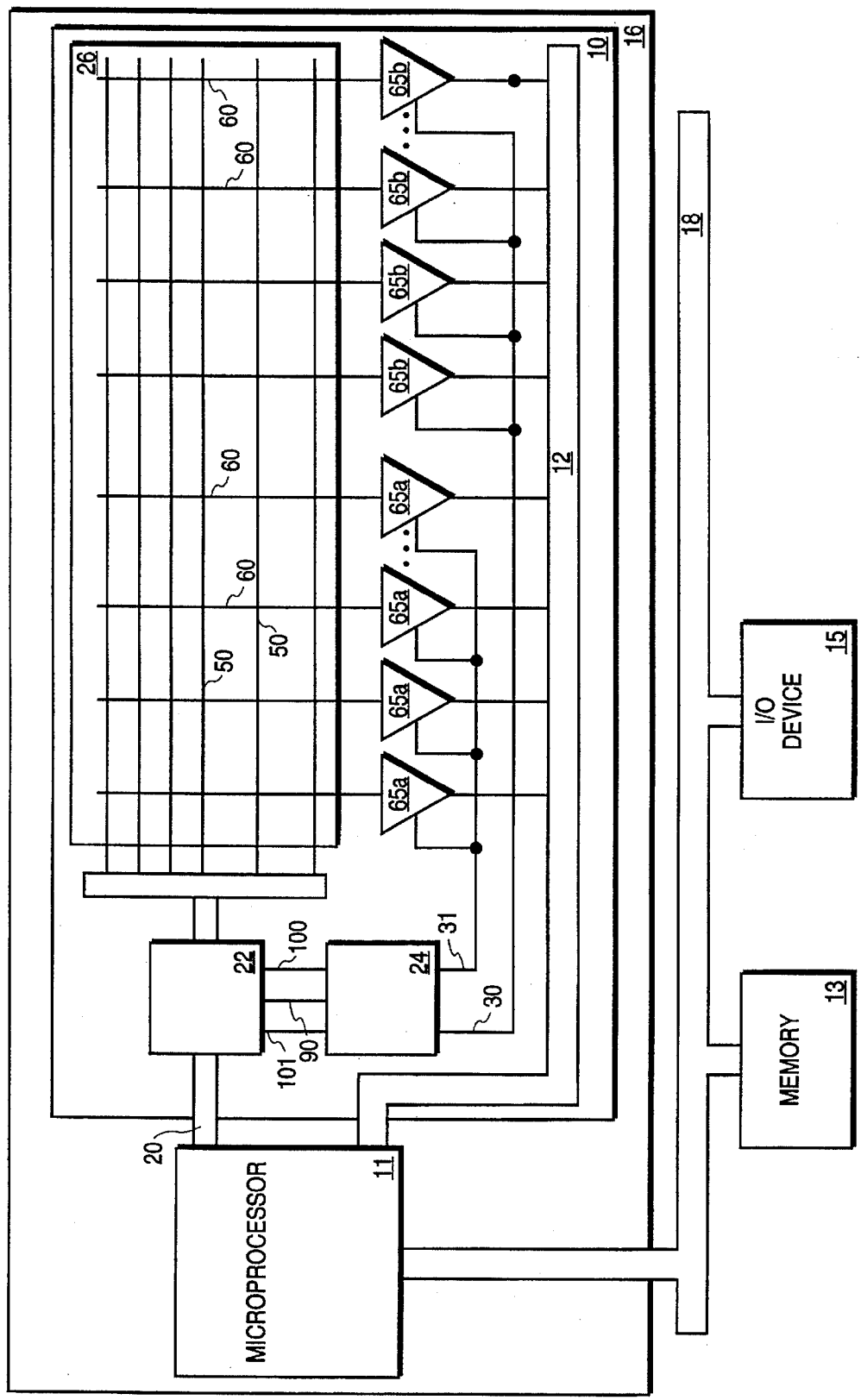
FIG. 1 is a block diagram of a computer system according to the present invention.

FIG. 1 is a schematic representation of a computer system incorporating a preferred embodiment of the invention. Cache memory 10 and microprocessor 11 are shown encapsulated together within package 16. The microprocessor is coupled to a system bus 18, through which it can communicate to other system components including memory 13 and input/output device 15. The microprocessor 11 and cache memory 10 are coupled together by address bus 20 and data bus 12. Within cache memory 10 only a single bank of memory is illustrated. Multiple banks are incorporated in an actual embodiment, the technique for which is well known in the art.

When a read request is made by microprocessor 11 on address bus 20 to cache memory 10, decoding circuit 22 determines the order that the data should be read back to the microprocessor on data bus 12. Based on the determination made by decoding circuit 22, sense enable timing circuit 24 is placed in one of two states by select signals sent through select lines 100 and 101. Decoding circuit 22 also causes address lines 50, which run horizontally through the memory array 26, to couple the proper memory storage elements located within the memory storage array 26 to sense lines 60. Then, sense enable timing circuit 24 enables sense amps 65a and 65b through sense enable lines 30 and 31 causing sense amps 65a and 65b to sense the data on sense lines 60 and to drive that data onto data bus 12.

If configured in accordance with prior art techniques, sense enable lines 30 and 31 would be coupled together as a single sense enable line. Thus, the enable signal would be received simultaneously by sense amps 65a and 65b to drive all data bits onto data bus 12 simultaneously. In a system where the number of sense amps being enabled is large, as with wide data buses or burst mode read and writes, a power surge that occurs as a result of simultaneous operation of the sense amps introduces supply noise into the system which can interrupt normal operation. The number of sense amps used in the system incorporating a preferred embodiment of the invention is 1,152.

When configured in accordance with a preferred embodiment of the invention, the sense amp enable from sense enable lines 30 and 31 are offset slightly so that sense amps 65a and 65b are not enabled at the same time. Since sense amps require the greatest amount of power during the first 300 picoseconds (ps), a delay of only this much time is sufficient to reduce the overall power surge substantially without affecting the time it takes to read the data, which can take several nano-seconds in a standard cache memory.

During normal operation of the cache memory a "master" enable signal is transmitted through line 90 to the sense enable timing circuit 24. This master enable is sent as soon as possible after the memory storage circuits have been coupled to the sense lines 60 so that the read is accomplished as quickly as possible. The select signals applied through lines 100 and 101 determine whether the enable signal sent through line 30 or line 31 is delayed. The selection could also be accomplished with a single select line instead of the two lines 100 and 101 shown. However, for various reasons not relevant to the invention two signal lines are used in the preferred embodiment. In response to the master enable signal and the two select signals, two sense enable signals are generated by sense enable timing circuit 24 and then transmitted from lines 30 and 31 to a first set of sense amps 65a and to a second set of sense amps 65b.

Figure 2:
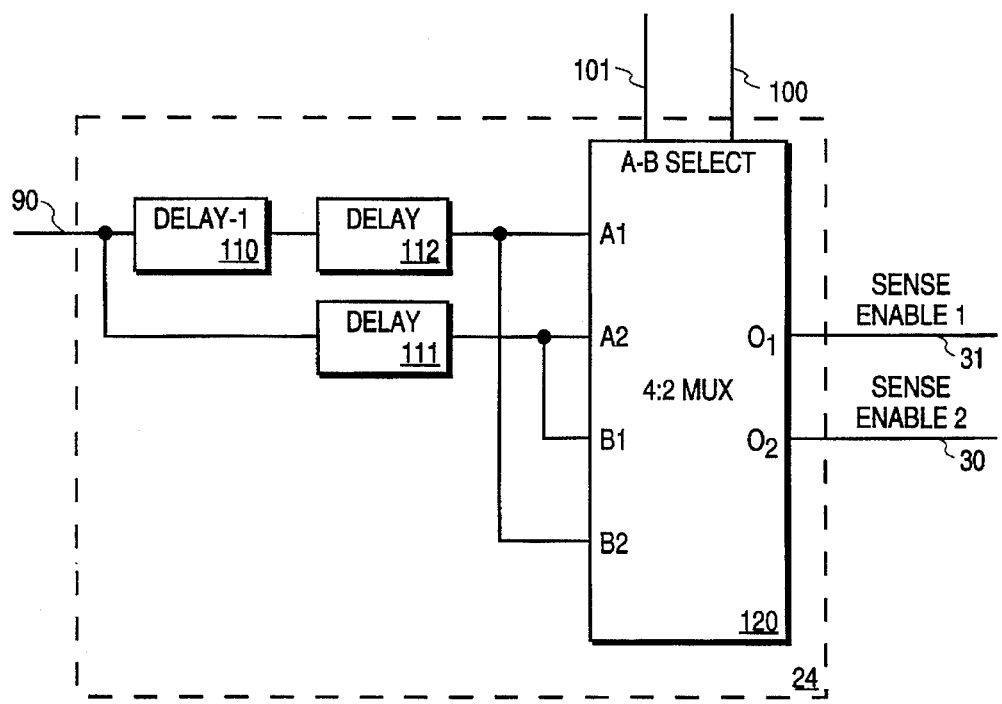
FIG. 2 is a block diagram of a sense enable timing circuit.

FIG. 2 is a block diagram of the sense enable timing circuit 24 shown in FIG. 1. The sense enable timing circuit 24 generates two enable signals offset in time from each other and, based on select signals, transmits those signals in one of two ways on outputs 30 and 31. During normal operation a master enable signal is transmitted through line 90 to a first delay circuit 110, and a second delay circuit 111. In a preferred embodiment the delay circuits are inverters. The output from the second delay circuit 111 is transmitted to two inputs of a four-to-two multiplexor 120. The output of first delay circuit 110 is transmitted to third delay circuit 112, and then to the other two inputs of multiplexor 120. Thus, the signal from third delay circuit 112 is delayed with respect to the signal from delay element 111.

Lines 100 and 101 transmit select signals into the select inputs of multiplexor 120. The outputs of the second and third delay circuits are coupled to the inputs of multiplexor 120 as shown, so that the delayed signal is transmitted through either output $O_1$ or $O_2$ depending on the state of the multiplexor select signals transmitted on lines 100 and 101. This allows one set of sense amps to be enabled before the other depending on the burst order of the read request detected by decoding circuit 22.

Figure 3:
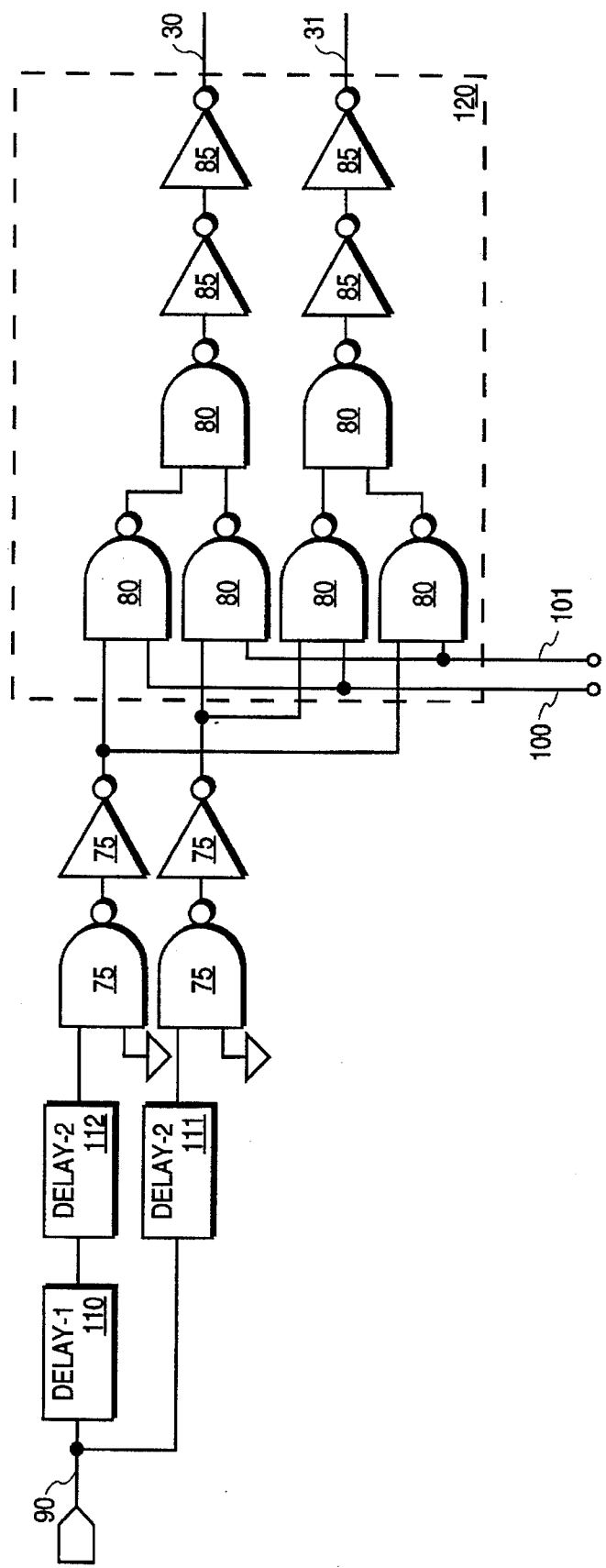
FIG. 3 is a circuit diagram of a preferred embodiment of the sense enable timing circuit.

FIG. 3 is a circuit diagram of a preferred embodiment of the sense enable timing circuit 24. The master enable signal is transmitted through line 90 into first delay circuit 110, providing a delay of amount "delay-1", and second delay circuit 111, providing a delay of amount "delay-2". The output of first delay circuit 110 is fed into third delay circuit 112, which provides a delay of amount "delay-2". The two signals from the second and third delay elements 111 and 112 are then transmitted to buffers 75 and then to multiplexor 120 which is shown to be comprised of six NAND gates 80, and four inverters 85. Outputs 30 and 31 from multiplexor 120 transmit the first and second enable signals which are offset by an amount "delay-1" from each other, which in a preferred embodiment is 300 ps. Depending on the read burst order requested by the microprocessor, select signals are placed on lines 100 and 101 so that the delayed signal is output from either line 30 or 31. The signals on lines 30 and 31 are then distributed to different sets of sense amps each comprising one half, or 576, of the total number of sense amps 1152.

In a preferred embodiment of the invention, the sense enable signals output on lines 30 and 31 are distributed throughout cache memory 10 using various buffers, dividers, and driving circuits. The use of such distribution circuitry is common in cache memories. Because, however, the time at which sense amps 65a and 65b are enabled is important, the circuitry used in preferred embodiments of the invention to distribute the two sense enable signals are matched as closely as possible so that the delay introduced by sense enable timing circuitry 24 is still present after both signals have gone through the distribution circuitry.

Those skilled in the art will recognize various alternative methods for implementing the described invention. These include, but are not limited to, providing different delay periods, dividing the sense enable signals into more than two groups, and using alternative logic designs. In general, the exemplary embodiments described herein are merely illustrative of the invention and should not be taken as limiting the scope of the invention.

What is claimed is:

1. A computer system comprising:

bus means for transmitting data;

memory means, coupled to said bus, for storing said data;

microprocessor means, coupled to said bus, for processing said data;

cache memory means, coupled to said microprocessor, for storing said data, said cache memory means having:

first integrated circuit means configured respectively to enable first and second sets of sense amps at different points in time; and second integrated circuit means configured selectively to cause the first set of sense amps to be enabled before or after the second set of sense amps is enabled.

2. The computer system set forth in claim 1 wherein the first integrated circuit means is configured to enable the first set of sense amps at a point in time different from a point in time at which the second set of sense amps is enabled by a time period shorter than that required to read data from the cache memory means.

3. The computer system set forth in claim 1, wherein said first integrated circuit means comprises:

input means for receiving a master enable signal;

delay circuit means, coupled to said input means, for creating a delayed signal by introducing a delay to said master enable signal; and transmission circuit means, coupled to said delay circuit means, for sending said master enable signal and said delayed signal to said second integrated circuit means.

4. The computer system set forth in claim 3 wherein said second integrated circuit means comprises:

multiplexor means, coupled to said transmission means, for coupling said master signal to said first set of sense amps and said delayed signal to said second set of sense amps when in a first state, and coupling said master signal to said second set of sense amps and said delayed signal to said first set of sense amps when in a second state.

5. The computer system of claim 4 further comprising:

signal means for placing said multiplexor means in said first state when a first type of read request is detected, and placing said multiplexor means is in said second state when a second type of read request is detected.

6. A computer system comprising:

a bus that transmits data;

a memory, coupled to said bus, that stores said data;

a microprocessor, coupled to said bus, that processes said data; and a cache memory, coupled to said microprocessor, that stores said data, said cache memory having an integrated circuit configured selectively to enable a first set of sense amps before or after a second set of sense amps is enabled.

7. The computer system set forth in claim 6 wherein the integrated circuit is configured to enable the first set of sense amps at a point in time different from a point in time at which the second set of sense amps is enabled by a time period shorter than that required to read data from the memory.

8. The computer system set forth in claim 6, wherein said integrated circuit comprises:

an input that receives a master enable signal; and a delay circuit, coupled to said input, that creates a delayed signal by introducing a delay to said master enable signal.

9. The computer system set forth in claim 8 wherein said integrated circuit comprises:

a multiplexor that couples said master signal to said first set of sense amps and said delayed signal to said second set of sense amps when in a first state, and couples said master signal to said second set of sense amps and said delayed signal to said first set of sense amps when in a second state.

10. The computer system set forth in claim 9 further comprising:

a signal that places said multiplexor in said first state when a first type of read request is detected, and places said multiplexor is in said second state when a second type of read request is detected.

* * * * *